United States Patent
Wu et al.

(10) Patent No.: US 6,844,207 B2
(45) Date of Patent: Jan. 18, 2005

(54) METHOD AND DEVICE FOR DETECTING WHETHER THE ALIGNMENT OF BIT LINE CONTACTS AND ACTIVE AREAS IN DRAM DEVICES IS NORMAL

(75) Inventors: Tie Jiang Wu, Ilan Hsien (TW); Chien-Chang Huang, Banchiau (TW); Yu-Wei Ting, Taipei (TW); Bo Ching Jiang, Hualien Hsien (TW); Chin-Ling Huang, Taipei Hsien (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/452,179

(22) Filed: Jun. 2, 2003

(65) Prior Publication Data

US 2004/0029301 A1 Feb. 12, 2004

(30) Foreign Application Priority Data

Aug. 9, 2002 (TW) .......................................... 91117960

(51) Int. Cl.$^7$ .......................... H01L 31/26; H01L 21/66
(52) U.S. Cl. ............................ 438/14; 438/18; 438/462
(58) Field of Search .......................... 438/14, 18, 329, 438/330, 381, 462

(56) References Cited

U.S. PATENT DOCUMENTS 5,014,103 A * 5/1991 Ema ............................ 257/296
6,693,834 B1 * 2/2004 Wu et al. ..................... 365/201

* cited by examiner

Primary Examiner—Phuc T. Dang
(74) Attorney, Agent, or Firm—Quintero Law Office

(57) ABSTRACT

Method for detecting whether the alignment of bit line contacts and active areas in DRAM devices is normal, and a test device thereof. In the present invention a plurality of memory cells are formed in the memory area and at least one test device is formed in the scribe line region simultaneously. A first resistance and a second resistance are detected by the test device. Normal alignment of the bit line and the bar-type active area of the test device is determined according to the first resistance and the second resistance. Finally, whether the alignment of the bit line contacts and the active areas in memory areas is normal is determined according to whether the alignment of the bit line contact and bar-type active area of the test device is normal.

3 Claims, 2 Drawing Sheets

METHOD AND DEVICE FOR DETECTING WHETHER THE ALIGNMENT OF BIT LINE CONTACTS AND ACTIVE AREAS IN DRAM DEVICES IS NORMAL

BACKGROUND OF THE INVENTION

1. Field of the Invention

The present invention relates to a test method, and in particular to a method for detecting whether the alignment of bit line contacts and active areas in DRAM devices is normal, as well as a test device thereof.

2. Description of the Related Art

FIG. 1 is a layout of conventional deep trench capacitors in a memory device. Deep trench capacitors 10 are disposed under the passing word lines. Transistors 14 are electrically coupled to the storage nodes 16 of the capacitors 10 through the diffusion regions 18. The diffusion regions 20 are connected to plugs 22 coupled to bit lines (not shown). The transistors 14 are driven by word lines 12, the channels under the word lines 12 are conductive when appropriate voltages are applied to the word lines 12. Consequently, the current produced between the diffusion regions 18 and 20 may flow into or out of the storage nodes 16.

After the deep trench capacitors 10 are completely formed in the substrate, trench isolations are formed in the substrate and deep trench capacitors 10 to define active areas. The word lines 12 are then formed on the substrate, the diffusion regions 18 and 20 are formed in the active areas by word lines 12 during the implant process, and the diffusion regions 18 and 20 are located on two sides of the word lines 12. Finally, the plugs 22 are formed on the diffusion regions 20. The adjacent memory cells may have a current leakage and cell failure which reduce the process yield if the masks of active areas and the bit line contacts did not align accurately.

Therefore, the process yield and reliability of the memory cells can be improved if alignment inaccuracy between the masks of active areas and the bit line contacts can be controlled within an acceptable range.

SUMMARY OF THE INVENTION

Accordingly, an object of the invention is to detect whether the alignment of bit line contacts and active areas in DRAM devices is normal.

According to the above mentioned objects, the present invention provides a test device for detecting whether the alignment of bit line contacts and active areas in DRAM devices is normal.

In the test device of the present invention, a bar-type active area is disposed in the scribe line and has a center, a predetermined width and a predetermined resistivity. A bit line contact is disposed on the center of the bar-type active area. A bit line has a first terminal, a second terminal and a center, wherein the center is coupled to the bit line contact, and the bit line is essentially perpendicular to the bar-type active area. Two plugs are disposed on the first terminal and the second terminal of the bar-type active area respectively, and the two plugs are electrically coupled to the first terminal and the second terminal of the bar-type active area respectively.

According to the above mentioned objects, the present invention also provides a method for detecting whether the alignment of bit line contacts and active areas in DRAM devices is normal.

In the method of the present invention, a wafer with at least one scribe line region and at least one memory area is provided. A plurality of memory cells in the memory area and at least one test device in the scribe line region are formed simultaneously, wherein the memory area has bit line contacts and active areas. A first resistance and the second resistance are detected by the first terminal and second terminal of the bit line and the two plugs of the test device, respectively. Whether the alignment of the bit line contact and the bar-type active area of the test device are normal is determined according to the first resistance and the second resistance. Finally, normal alignment of the bit line contacts and the active areas in memory devices is determined according to whether the alignment of the bit line contact and bar-type active area of the test device is normal.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
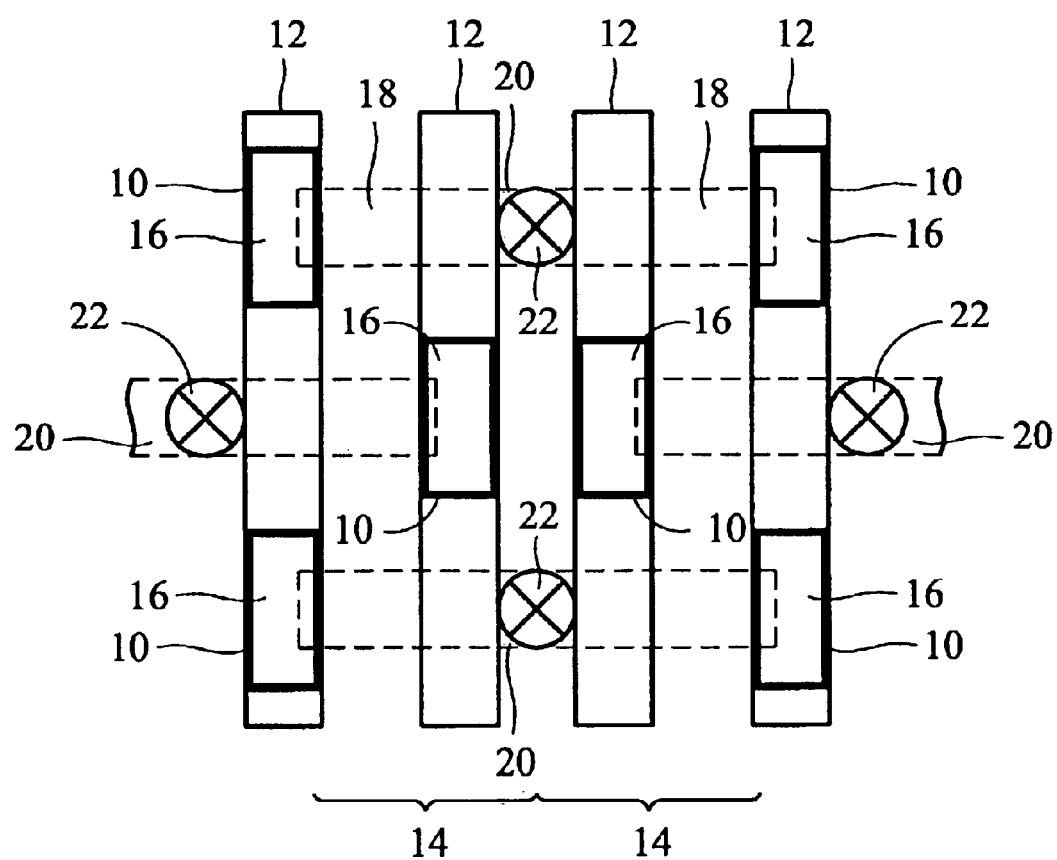
FIG. 1 is a layout of conventional deep trench capacitors in a memory device.
Figure 2:
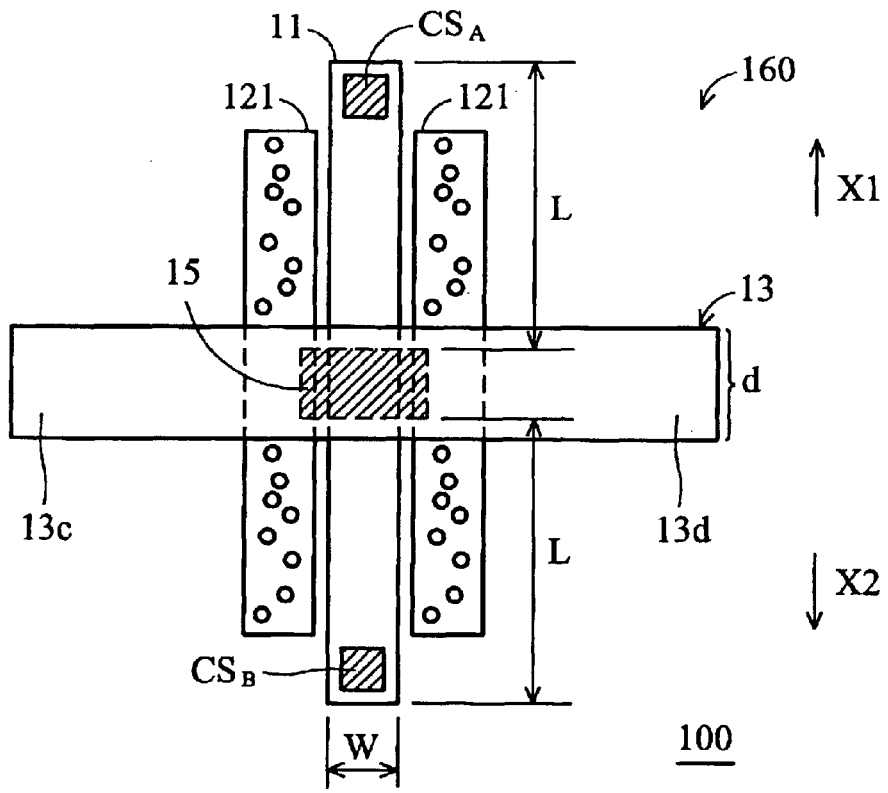
FIG. 2 is a layout of the test device according the present invention.

FIG. 2 is a layout of the test device according the present invention. The test device detects whether the alignment of bit line contacts and active areas in DRAM devices is normal, wherein at least one test device is disposed a scribe line region 160 of a wafer 100.

A bar-type active area 11 is defined in the scribe line region 160 of the wafer 100 by trench isolation, wherein the bar-type active area 11 has a predetermined width W, and a center. A bit line contact 15 is disposed on the center of the bar-type active area 11. A bit line 13 has a center aligned to the bit line contact 15, and a first terminal 13c and a second terminal 13d. The bit line 13 is essentially perpendicular to the bar-type active area 11. Further, two plugs $CS_A$ and $CS_B$ are disposed on the first and second terminals of the bar-type active area 11. Two word lines 121 are disposed above two sides of the bar-type active area 11 respectively, and the two word lines 121 are essentially parallel to each other.

Figure 3:
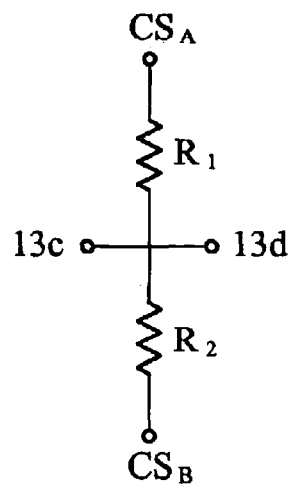
FIG. 3 shows the equivalent circuit diagram of the test device according to the present invention.

FIG. 3 shows the equivalent circuit diagram of the test device according to the present invention. Usually, a first resistance $R_1$ can be determined by the first plug $CS_A$ and the first terminal 13c of the bit line 13, and a second resistance $R_2$ can be determined by the second plug $CS_B$ and the second terminal 13d of the bit line 13. For example, a first corresponding current can be detected by applying an appropriate voltage difference between the first plug $CS_A$ and the first terminal 13c of the bit line 13. Also, a second corresponding current can be detected by applying an appropriate voltage difference between the second plug $CS_B$ and the second terminal 13d of the bit line 13. Consequently, the first and second resistance levels ($R_1$ and $R_2$) are obtained according to the first and second corresponding current and the appropriate voltage difference.

The first resistance $R_1$ includes a resistance Rac, a Junction resistor CBR between the bit line contact 15 and the bar-type active area 11, and a junction resistor $CSR_1$ between the bar-type active area 11 and the first plug $CS_A$. That is $R_1 = Rac + CBR + CSR_1$ (1)

The second resistance $R_2$ includes a resistance Rbd, a junction resistor CBR between the bit line contact 15 and the bar-type active area 11, and a junction resistor $CSR_2$ between the bar-type active area 11 and the second plug $CS_B$. That is $R_2 = Rbd + CBR + CSR_2$ (2)

Further, the resistance levels $$Rac = R_{AA} \times \frac{(L + \Delta L)}{W} \quad (3)$$

$$Rbd = R_{AA} \times \frac{(L - \Delta L)}{W} \quad (4)$$

Equations 5 and 6 are obtained by substituting equations 3 and 4 in equations 1 and 2 respectively.

$$R_1 = R_{AA} \times \frac{L + \Delta L}{W} + CBR + CSR_1 \quad (5)$$

$$R_2 = R_{AA} \times \frac{L - \Delta L}{W} + CBR + CSR_2 \quad (6)$$

The junction resistance $CSR_1$ between the first plug $CS_A$ and the active area 11 equals the junction resistance $CSR_2$ between the second plug CSB and the active area 11 because the bit line contact 15 and the first and second plugs $CS_A$ and $CS_B$ are formed in the same process with the same conditions and parameters. Also, resistance per unit area in equations 5 and 6 are both $R_{AA}$ (predetermined resistivity), and two sides of active area 11 both have a predetermined width w. Furthermore, the distance from the bit line contact 15 to the first and second terminals (13c and 13d) are both L. Thus, equations 7 and 8 are obtained according to the equations 5 and 6.

$$R_1 - R_2 = R_{AA} \times \frac{2\Delta L}{W} \quad (7)$$

$$\Delta L = W \times \frac{R_1 - R_2}{2 R_{AA}} \quad (8)$$

Therefore, the alignment shift $\Delta L$ between the bit line contact 15 and the bar-type active area 11 can be obtained if the first resistance $R_1$ and the second resistance $R_2$ are detected. That is to say, the alignment between the bit line contact 15 and the bar-type active area 11 is normal when the first resistance $R_1$ equals the second resistance $R_2$.

For example, reference to FIG. 2, the lit line Contact 15 is shifted by a distance $\Delta L$ along the direction X1 if the masks of bit line contact 15 and the bar-type active area 11 have an alignment shift $\Delta L$ in the direction X1. If this condition is met, the first resistance $R_1$ is smaller than the second resistance $R_2$ because the resistance is proportional to the length of the conductor, and the alignment shift $\Delta L$ can be obtained according to the equation 8. Also, the lit line contact 15 is shifted a distance $\Delta L$ along the direction X2 if the masks of bit line contact 15 and the bar-type active area 11 have an alignment shift $\Delta L$ in the direction X2. If this condition is met, the first resistance $R_1$ is larger than the second resistance $R_2$ because the resistance is proportional to the length of the conductor, and the alignment shift $\Delta L$ can be obtained according to the equation 8.

The invention also provides a method for detecting whether the alignment of bit line contacts and active areas in DRAM devices is normal. In the method of the present invention, a wafer 100 with at least one scribe line region 160 and at least one memory area is provided.

A plurality of memory cells in the memory area and at least one test device in the scribe line region are formed simultaneously, wherein the memory area has bit line contacts and active regions. The structure of the test device is shown in FIG. 2, and the active areas in the memory regions and the bar-type active area in the test device are formed by the same mask and the same process, the bit line contacts in the memory device and the test device are formed by the same mask and the same process.

After that, the first resistance $R_1$ is detected by the first plug $CS_A$ and the first terminal 13c of the bit line 13 in the test device, and the second resistance $R_2$ is detected by the second plug $CS_B$ and the second terminal 13d in the test device.

The normal alignment of bit line contact 15 and bar-type active area of test device is determined according to whether the first resistance $R_1$ is equal to the second resistance $R_2$.

The memory area and test device may have the same alignment shift between the bit line contacts and the active areas due to use of the same masks and the same process. Thus, normal alignment of bit line contacts and active areas in memory areas can be obtained according to whether the alignment of bit line contact 15 and bar-type active area 11 of the test device is normal. The alignment shift between the bit line contacts and the active areas in the memory area can be obtained according to the equation 8.

In the present invention, the test device is disposed in the scribe line region and is formed by the same masks and process as the bit line contacts and active areas in memory areas simultaneously. Therefore, the test device disposed in the scribe line region can detect the alignment shift between the bit line contacts and the active areas in memory areas because the test device and the memory areas may have the same alignment shift when masks have misalignments. Further, in the present invention the test device is disposed in the scribe line region to avoid occupying layout space in the memory areas.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A test device for detecting whether the alignment of bit line contacts and active areas in DRAM devices is normal, wherein the test device is disposed in a scribe line region of a wafer, comprising:

a bar-type active area, disposed in the scribe line region, having a center, a first terminal, and a second terminal;

a bit line contact disposed on the center of the bar-type active area;

a bit line having a center coupled to the bit line contact, and a first terminal and a second terminal, wherein the bit line is essentially perpendicular to the bar-type active area; and two plugs disposed on the first terminal and the second terminal of the bar-type active area respectively, wherein the two plugs are electrically connected to the first terminal and the second terminal of the bar-type active area respectively.

2. The test device as claimed in claim 1, further comprising two word lines disposed above two sides of the bar-type active area respectively, and the two word lines are essentially parallel to each other.

3. The test device as claimed in claim 1, wherein a first resistance is detected by the first terminal of the bit line and one of the two plugs, and a second resistance is detected by the second terminal of the bit line and the other of the two plugs, and the alignment of the bit line contact and the bar-type active area is abnormal if the first resistance is not equal to the second resistance.

* * * * *